(12) United States Patent
Gens et al.

(10) Patent No.: US 11,271,570 B1
(45) Date of Patent: Mar. 8, 2022

(54) SYSTEM COMPRISING A SLAVE MODULE AND A MASTER MODULE

(71) Applicants: STMicroelectronics (Grenoble 2) SAS, Grenoble (FR); STMicroelectronics (Alps) SAS, Grenoble (FR)

(72) Inventors: Marc Gens, Uriage (FR); David Jacquet, Vaulnaveys le Haut (FR); Fabien Pousset, Saint Martin D'uriage (FR); Elias El Haddad, Gernoble (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 16/951,748

(22) Filed: Nov. 18, 2020

(30) Foreign Application Priority Data

Nov. 13, 2020 (FR) ...................... 2011671

(51) Int. Cl.
| | |
|---|---|
| H03K 21/00 | (2006.01) |
| H03K 21/08 | (2006.01) |
| G01R 21/00 | (2006.01) |
| G01K 1/02 | (2021.01) |
| G01K 13/00 | (2021.01) |
| H03K 21/40 | (2006.01) |
| H03K 21/38 | (2006.01) |
| H03K 23/42 | (2006.01) |

(52) U.S. Cl.
CPC .............. *H03K 21/08* (2013.01); *G01K 1/02* (2013.01); *G01K 13/00* (2013.01); *G01R 21/00* (2013.01); *H03K 21/38* (2013.01); *H03K 21/40* (2013.01); *H03K 21/403* (2013.01); *H03K 23/42* (2013.01)

(58) Field of Classification Search
None
See application file for complete search history.

(56) References Cited

U.S. PATENT DOCUMENTS

| | | | |
|---|---|---|---|
| 2003/0117181 A1* | 6/2003 | Powell | G01R 23/10 327/48 |
| 2014/0282435 A1* | 9/2014 | Fukuda | G06F 11/3419 717/131 |
| 2015/0331027 A1* | 11/2015 | Mearns | G01R 23/10 324/76.39 |
| 2016/0261816 A1* | 9/2016 | Margaux | H04N 5/33 |
| 2020/0065200 A1* | 2/2020 | Uttley | G06F 11/1604 |
| 2021/0063451 A1* | 3/2021 | Takahashi | G01R 23/10 |

* cited by examiner

*Primary Examiner* — Tuan T Lam
(74) *Attorney, Agent, or Firm* — Slater Matsil, LLP

(57) ABSTRACT

The system comprising a slave module and a master module. The master module comprises a master control module (CONTRM). The slave module comprises a determination module (DETER). The determination module (DETER) is configured to determine a value of a physical quantity of the slave module. The determination module (DETER) is configured to receive, from the master control module (CONTRM), a command to start counting and a command to end counting. The determination module (DETER) is configured to determine a number of oscillations, between reception of the command to start counting and reception of the command to end counting, of an oscillating signal of which a frequency depends on the value of the physical quantity.

22 Claims, 3 Drawing Sheets

SYSTEM COMPRISING A SLAVE MODULE AND A MASTER MODULE

CROSS-REFERENCE TO RELATED APPLICATIONS

This application claims priority to French Patent Application No. 2011671, filed on Nov. 13, 2020.

FIELD OF THE INVENTION

The present invention relates to, generally speaking, electronic chips. It relates more specifically to electronic chips comprising a module for determining a value of a physical quantity of the electronic chip.

PRIOR ART

Some electronic chips comprise a device for determining a value of a physical quantity of the chip. This physical quantity is, for example, a temperature of the chip or a power, a voltage or a current inside the chip, for example of a signal delivered by the chip.

These chips, called slave chips, are generally connected to another electronic chip, called master chip. The master chip controls the slave electronic chip and may in particular obtain the value of the physical quantity.

The determination of the value of this physical quantity may be carried out by an analogue to digital converter (ADC), conventionally a successive approximation analogue to digital converter (SAADC). However, analogue to digital converters have a too important used surface area and a too high cost and require a timer.

In addition, known systems use a plurality of connections between the master and the slave, which makes the interface expensive, has an important used surface area on the printed circuit board (PCB) and may cause radioelectric interference.

There is thus a need for a system comprising a slave electronic chip and a master electronic chip, in which the master electronic chip can obtain the value of the physical quantity of the slave electronic chip and which does not have the limitations of known systems.

DESCRIPTION OF THE INVENTION

To this end, a system is provided according to the invention. The system comprises a slave module, and a master module. The master module comprises a master control module. The slave module comprises a determination module. The determination module is configured to determine a value of a physical quantity of the slave module, the determination module is configured to receive, from the master control module, a command to start counting and a command to end counting, the determination module is configured to determine a number of oscillations, between reception of the command to start counting and reception of the command to end counting, of an oscillating signal of which a frequency depends on the value of the physical quantity, the determination module is configured to send, to the master control module, the number of oscillations, the master control module is configured to determine the value of the physical quantity from the number of oscillations and from a duration separating the sending of the command to start counting and the sending of the command to stop counting.

The system thus enables the determination of a value of a physical quantity of a slave module, and the transmission of this value to a master module, without the slave module requiring an analogue to digital converter. The system also has the advantage of not requiring a precise timer in the slave module, because the timer is calibrated in production and the value of the calibration memorised for the slave module.

Thus this arrangement, between these two modules, of the functions carried out by the master module and the slave module and the communication used between the two, allows a same master module to control several slave modules while limiting the number of connections between the master and the slaves.

In an embodiment, the determination module comprises a sensor configured to determine the value of the physical quantity, and to emit a signal of which a voltage or a current depends on the value of the physical quantity, a voltage or current controlled oscillator, configured to generate the oscillating signal of which the frequency depends on the voltage or the current of the signal emitted by the sensor, and a counter configured to count the number of oscillations of the oscillating signal. The counter is configured to start counting on reception of the command to start counting and to stop counting on reception of the command to end counting.

In an embodiment, the determination module comprises a storage module configured to store the number of oscillations counted between reception of the command to start counting and reception of the command to end counting and to send to the master control module the number of oscillations.

In an embodiment, the slave module and the master module are connected by a serial link.

This serial link makes it possible to limit costs by the reuse of a simple and already implemented interface.

In an embodiment, the sensor comprises a temperature sensor, the temperature sensor is configured to determine a temperature of the slave module, the physical quantity is the temperature of the slave module.

In an embodiment, the sensor comprises a power sensor, the power sensor is configured to determine a power of a signal of the slave module, the physical quantity being the power of the signal of the slave module.

In an embodiment, the sensor comprises a temperature sensor and a power sensor, the determination module comprises a selection module configured to receive a selection command and to select the temperature sensor or the intensity sensor as a function of the selection command.

In an embodiment, the master module comprises a timer generating a timer signal, the command to start counting and the command to end counting are emitted in a synchronous manner with the timer signal In an embodiment, the slave module is implemented on a slave integrated circuit comprised in a slave chip, the master module being implemented on a master integrated circuit comprised in a master electronic chip.

DESCRIPTION OF THE FIGURES

Other characteristics, aims and advantages of the invention will become clear from the description that follows, which is purely illustrative and non-limiting and which should be read with regard to the appended drawings in which.

DETAILED DESCRIPTION OF THE INVENTION

It is pointed out that, in the figures, full squares represent an input port (an input), an output port (an output) or a bidirectional port (comprising an input and an output) and full discs represent an electrical connection between two wires.

Hereafter, inputs are indicated by a reference beginning with the number 1, outputs by a reference beginning with the number 2 and bidirectional ports by a reference beginning with the number 3.

Figure 1:
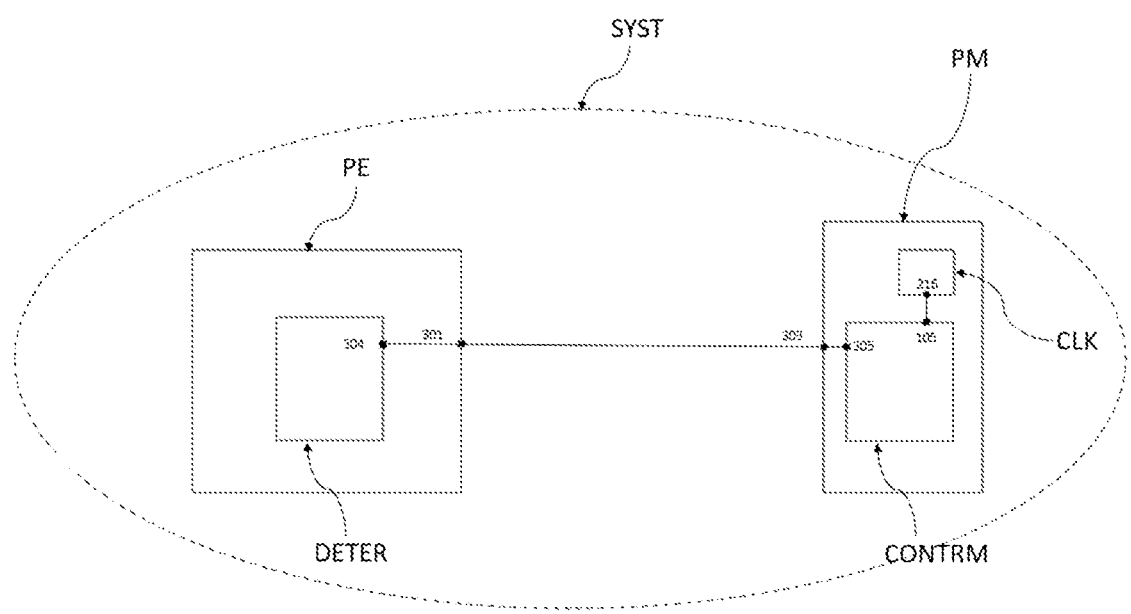
FIG. 1 represents a system of the invention.

FIG. 1 represents a system SYST comprising a slave module comprised in a slave electronic chip PE and a master module comprised in a master electronic chip PM.

A slave electronic chip is for example a radio frequency electronic chip which is a chip enabling the conversion of a digital signal into a radio signal being able to be emitted by an antenna and the conversion of a radio signal received from the antenna into a digital signal.

It is also possible to connect a plurality of slave modules to the same master module in order that it can control the slave modules.

The slave module and the master module are connected to each other by a link for example of serial type.

The slave electronic chip PE comprises an integrated circuit. The integrated circuit is placed in a full, rectangular casing. The casing comprises tabs (also called "broaches" or "pins") on one or more sides, or even on a face. These tabs make it possible to establish electrical connections between the integrated circuit and elements external to the casing. The integrated circuit implements the different modules of the slave electronic chip PE.

The master electronic chip PM comprises an integrated circuit. The integrated circuit is placed in a full, rectangular casing. The casing comprises tabs (also called "broaches" or "pins") on one or more sides, or even on a face. These tabs make it possible to establish electrical connections between the integrated circuit and elements external to the casing. The integrated circuit implements the different modules of the master electronic chip PM.

The slave electronic chip PE comprises a bidirectional port 301 and the master electronic chip PM comprises a bidirectional port 33. The bidirectional port 301 and the bidirectional port 393 are connected together.

This link enables the transmission of the following commands:
Command to start counting
Command to end counting
Command to read a counter
Command to select the physical quantity to measure by the selection of a sensor.

This link also enables the transmission of a number of oscillations.

The slave electronic chip PE also comprises a determination module DETER. The determination module DETER comprises a bidirectional port 304. The bidirectional port 304 is connected to the bidirectional port 301 of the slave electronic chip PE to exchange commands and the number of oscillations. The determination module DETER is configured to determine the value of the physical quantity of the slave electronic chip PE. The determination module DETER is configured to determine a number of oscillations, between reception of the command to start counting and reception of the command to end counting, of an oscillating signal of which the frequency depends on the value of the physical quantity. The determination module DETER and the slave electronic chip PE are configured to send to the master electronic chip PM the number of oscillations.

The master electronic chip PM comprises a timer CLK. The timer CLK comprises an output 216 on which the timer CLK is configured to send a timer signal.

The master electronic chip PM comprises a master control module CONTRM. The master control module CONTRM comprises a bidirectional port 305 connected to the bidirectional port 303 of the master electronic chip PM. The master control module CONTRM comprises an input 105, connected to the output 216 of the timer CLK, to receive the timer signal. The master control module CONTRM is configured to send on the bidirectional port 305 the commands described above and to receive the number of oscillations.

The master control module CONTRM is configured to determine a value of the physical quantity from the number of oscillations and from the duration separating the sending of the command to start counting and the sending of the command to end counting.

Figure 2:
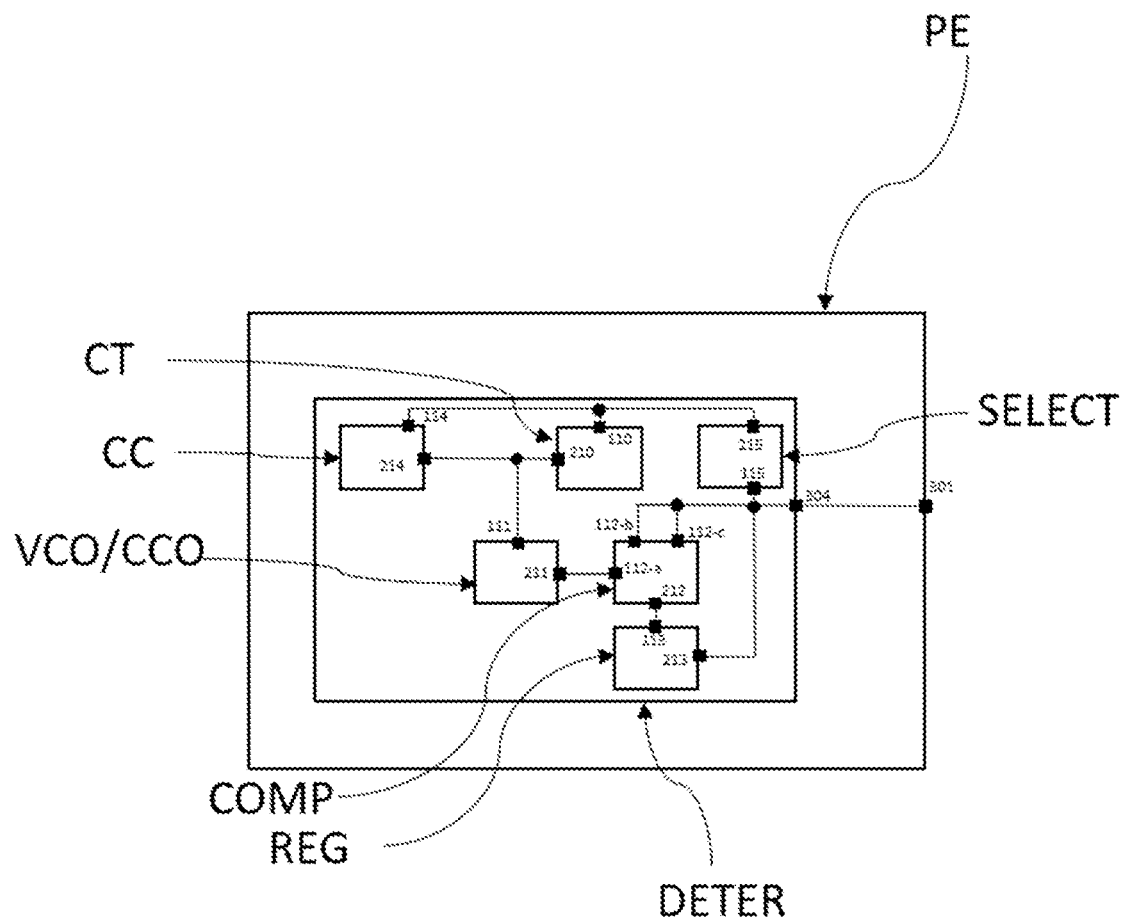
FIG. 2 represents the slave electronic chip of the invention.

FIG. 2 represents in a more detailed manner the slave electronic chip PE.

The determination module DETER comprises at least one sensor. This sensor is configured to determine the value of the physical quantity and to send on an output a signal of which the current or the voltage is a function of the physical quantity. This sensor is, for example, a temperature sensor CT. The temperature sensor CT is configured to determine a temperature of the slave electronic chip PE. The temperature sensor CT comprises an output 210 configured to send a signal of which the current or the voltage is a function of the determined temperature.

The determination module DETER comprises a voltage controlled oscillator (VCO), referenced VCO, or a current controlled oscillator (CCO), referenced CCO.

The oscillator VCO comprises an input 111 connected to the output 210 to receive the signal of which the voltage is a function of the temperature. The oscillator VCO is configured to send on its output 211 a signal of timer type (for example a voltage of square or sinusoidal wave type). The frequency of this signal is a function of the value of the voltage of the signal received on the input 111.

The oscillator CCO comprises an input 111 connected to the output 210 to receive the signal, of which the current is a function of the temperature. The oscillator CCO is configured to send on its output 211 a signal of timer type (for example a voltage of square or sinusoidal wave type). The frequency of this signal is a function of the value of the current of the signal received on the input 111.

The determination module DETER comprises a counter COMP. The counter COMP comprises an input 112-*a*, connected to the output 211, to receive the timer signal. The counter COMP comprises an input 112-*b*, connected to the port 304 of the determination module DETER, to receive the command to start counting and an input 112-*c*, connected to the port 304 of the determination module DETER, to receive the command to end counting. The counter COMP is configured to determine a number of oscillations, of the timer signal, between reception of the command to start counting and reception of the command to end counting. The counter COMP comprises an output 212, of data bus type, enabling the emission of the number of oscillations. Advantageously, the number of oscillations is counted on 11 bits or 16 bits.

The determination module DETER comprises a storage module REG, for example a register. The storage module REG comprises an input 113, of data bus type, connected to the output 212 to receive the number of oscillations. The storage module REG is configured to save the number of oscillations and to send on an output 213, connected to the port 304 the number of oscillations saved. Advantageously, the number of oscillations is stored on 8 bits or 16 bits.

The master control module CONTRM can determine the physical quantity from the conversion function of the sensor, VCO or CCO, the number of periods counted in the counter and the difference in time elapsed between the emission of the command to start counting and to end counting.

In an embodiment, the temperature sensor CT is replaced by a power sensor CC. This power sensor CC is configured to send on an output 214 a signal of which the current or the voltage depends on the power of the radio signal to emit. The output 214 is connected to the input 111 of the oscillator VCO or CCO.

In an embodiment, the determination module DETER comprises the temperature sensor CT and the power sensor CC. The temperature sensor CT comprises a selection input 110. The power sensor CC comprises a selection input 114. The determination module DETER comprises a selection module SELECT. The selection module SELECT comprises a port 115 connected to the port 304 to receive the commands and in particular the command for selection of the sensor. The selection module SELECT comprises an output 215 connected to the input 114 of the power sensor CC and to the input 110 of the temperature sensor CT, to send a selection signal to the sensor to select.

Figure 3:
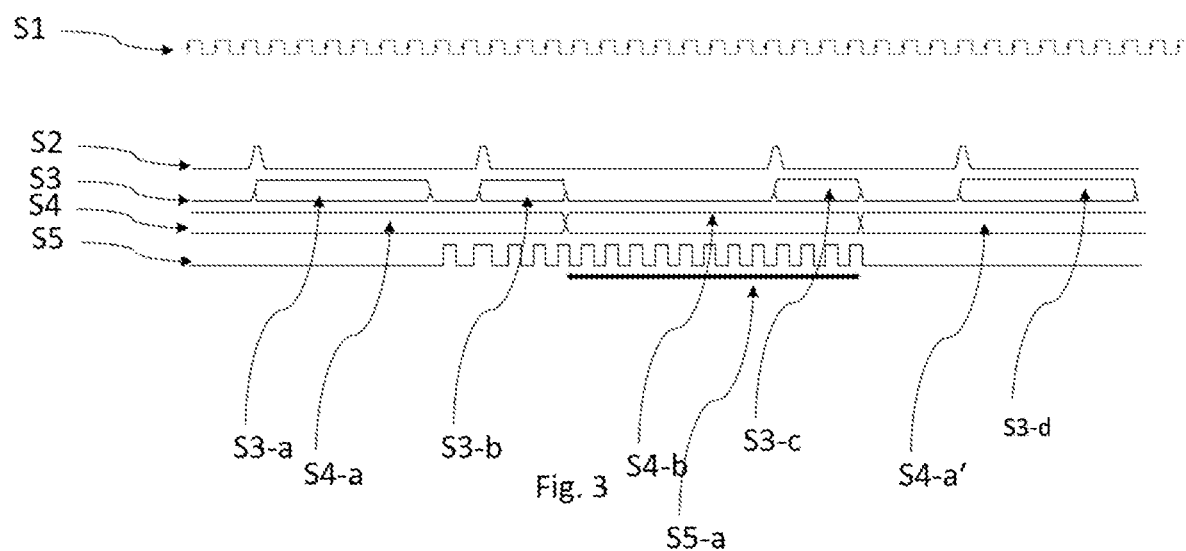
FIG. 3 represents a temporal flowchart of the emission of the command to start counting and the command to end counting by the master control module.

FIG. 3 represents a temporal flowchart of the emission of the command to start counting and the command to end counting by the master control module CONTRM. To ensure, in a deterministic and properly controlled manner, a difference in time of arrival between the command to start counting and the command to end counting, these messages are emitted in a synchronous manner with the timer signal generated by the timer CLK. Advantageously, this timer signal also enables the generation of a counter of an overall time of the master electronic chip PM. The command to start counting and the command to end counting are emitted at a precise instant, which is advantageously known with respect to the overall time counter. Each message of start of counting and each message of end of counting are emitted over a known number of cycles of the timer signal. Consequently, each message of start of counting and each message of end of counting arrive at a known and deterministic instant in the slave electronic chip PE.

The signal S1 represents the timer signal generated by the timer CLK. The signal S2 represents a signal representative of the overall time of the master electronic chip PM. The signal S3 represents the commands transmitted on the bidirectional port 301. In S3-*a* the master electronic chip sends to the slave chip the command to select the sensor relative to the physical quantity to measure. In S3-*b* the master electronic chip sends to the slave chip the command to start counting. In S3-*c* the master electronic chip sends to the slave chip the command to end counting. In S3-*d* the master chip sends the command to read the counter of the slave chip PE which replies to it by the sending value of the counter containing the number of oscillations. In S4 is represented the state of the slave electronic chip PE. In S4-*a* and S4-*a'*, the slave chip is on standby. In S4-*b*, the slave chip PE determines the value of the physical quantity. At the end of S4-*b*, the slave chip PE is ready to start the counter. S5 represents the timer type signal emitted on the output 211 of the VCO or CCO. The number of periods of this timer is counted by the counter COMP during the time interval S5-*a*.

Thus the system SYST of this invention enables the partitioning, between the master electronic chip PM and the slave electronic chip PE, of functionalities, enabling the determination of the value of a physical quantity of the slave electronic chip PE. This makes it possible to limit the cost of the assembly.

The master electronic chip PM is configured for the emission of signals for start of counting and for end of counting and for the determination of the duration separating the emission of two signals. These signals are emitted according to the timing given by the timer CLK of the master electronic chip PM.

The slave electronic chip PE is configured for the generation of an oscillating signal, of which the frequency of the oscillations is proportional to the value of the physical quantity. The value of this physical quantity is obtained by a sensor, for example a temperature sensor or a power sensor.

The slave electronic chip PE is configured to determine the number of oscillations that the oscillating signal makes between reception of the command to start counting and reception of the command to end counting.

Once the counting has terminated, the slave electronic chip PE supplies to the storage module REG the number of oscillations. The number of oscillations is transmitted to the master electronic chip PM.

Thus, the electronic chip PE carries out the determination of the value of the physical quantity and sends this value to the master electronic chip PM, by following the following steps:

Reception of a command to select a sensor relative to the physical quantity and generation of an oscillating signal, of which a frequency depends on the value of the physical quantity to control, Reception of the command to start counting the number of oscillations, starting the counting of the oscillations of the oscillating signal, Reception of the command to end counting of the number of oscillations, stopping the counting of the oscillations, Storage of the number of oscillations in the register REG and Transmission of the number of oscillations to the master electronic chip PM.

The invention claimed is:

1. A system for analog to digital conversion of a physical quantity comprising:
    a slave device configured to obtain an analog signal representative of the physical quantity and generate an oscillating signal based on the analog signal, the oscillating signal having a frequency indicative of a value of the physical quantity; and
    a master device,
    the slave device being further configured to
        receive, from the master device, a command to start counting and a command to end counting,
        determine a number of oscillations, between reception of the command to start counting and reception of the command to end counting, of the oscillating signal,
        send, to the master device, the number of oscillations, and the master device being configured to determine a digital value of the physical quantity from the number of oscillations and from a duration separating the sending of the command to start counting and the sending of the command to stop counting.

2. The system according to claim 1, wherein the slave device and the master device are connected by a serial link.

3. The system according to claim 1, wherein the slave device comprises:
- a sensor configured to measure the analog signal, the analog signal having a voltage or a current that depends on the physical quantity;
- a voltage or current controlled oscillator configured to generate the oscillating signal based on the voltage or the current of the analog signal; and
- a counter configured to count the number of oscillations of the oscillating signal, the counter being configured to start counting on reception of the command to start counting and to stop counting on reception of the command to end counting.

4. The system according to claim 3, wherein the slave device further comprises a memory configured to store the number of oscillations counted between reception of the command to start counting and reception of the command to end counting.

5. The system according to claim 3, wherein the sensor comprises a temperature sensor that is configured to determine a temperature at the slave device, the physical quantity being the temperature at the slave device.

6. The system according to claim 3, wherein the sensor comprises a power sensor that is configured to determine a power of a signal of the slave device, the physical quantity being the power of the signal of the slave device.

7. The system according to claim 3, wherein the sensor comprises a temperature sensor and a power sensor, the slave device further comprising a selection circuit configured to receive a selection command and to select the temperature sensor or the power sensor as a function of the selection command.

8. The system according to claim 1, wherein the master device comprises a timer configured to generate a timer signal, the command to start counting and the command to end counting being emitted synchronously with the timer signal.

9. The system according to claim 1, wherein the slave device comprises an integrated circuit of a slave chip and the master device an integrated circuit of a master electronic chip.

10. A device comprising:
- a sensor configured to determine a value indicative of a physical quantity and to generate a signal having a voltage or a current that depends on the value of the physical quantity;
- a voltage or current controlled oscillator coupled to the sensor configured to generate an oscillating signal based on the voltage or the current of the signal generated by the sensor;
- a bidirectional port configured to receive a command to start counting and a command to end counting; and
- a counter configured to count a number of oscillations of the oscillating signal starting in response to reception of a start command and stopping in response to reception of a stop command, wherein a duration between the start command and the stop command taken with the number of oscillations is indicative of the value of the physical quantity.

11. The device according to claim 10, wherein the bidirectional port is a serial port.

12. The device according to claim 10, wherein the sensor comprises a temperature sensor and the physical quantity is a temperature.

13. The device according to claim 10, wherein the sensor comprises a power sensor and the physical quantity is indicative of a power value.

14. The device according to claim 10, wherein the sensor comprises a temperature sensor and a power sensor, the device further comprising a selection circuit configured to receive a selection command and to select the temperature sensor or the power sensor as a function of the selection command.

15. A method of analog to digital conversion comprising:
- determining a value indicative of a physical quantity of a device;
- receiving a command to start counting and a command to end counting;
- generating an oscillating signal having a frequency that depends on the value indicative of the physical quantity;
- determining a number of oscillations of the oscillating signal between reception of the command to start counting and reception of the command to end counting; and
- transmitting information providing the number of oscillations, wherein a digital value of the physical quantity of the device can be determined by the number of oscillations and a duration of time between reception of the command to start counting and reception of the command to end counting.

16. The method according to claim 15, wherein the device is a slave device, the command to start counting and a command to end counting are received from a master device, and the information providing the number of oscillations is transmitted from the slave device to the master device.

17. The method according to claim 15, further comprising generating a signal having a voltage that depends on the value indicative of the physical quantity, wherein generating the oscillating signal comprises using a voltage controlled oscillator to generate the oscillating signal based on the voltage.

18. The method according to claim 15, further comprising generating a signal having a current that depends on the value indicative of the physical quantity, wherein generating the oscillating signal comprises using a current controlled oscillator to generate the oscillating signal based on the current.

19. The method according to claim 15, wherein determining the number of oscillations comprises initiating a counter upon receipt of the command to start counting and incrementing the counter in response to each oscillation until receiving the command to end counting.

20. The method according to claim 15, wherein determining the value indicative of the physical quantity comprises measuring a temperature.

21. The method according to claim 15, wherein determining the value indicative of the physical quantity comprises measuring a power level.

22. The method according to claim 15, further comprising measuring a temperature and measuring a power level, wherein determining the value indicative of the physical quantity comprising selecting either the temperature or the power level.

* * * * *